(12) United States Patent
He et al.

(10) Patent No.: US 12,186,952 B2
(45) Date of Patent: Jan. 7, 2025

(54) INJECTION MOULD AND INJECTION MOULDING METHOD

(71) Applicant: CHANGXIN MEMORY TECHNOLOGIES, INC., Hefei (CN)

(72) Inventors: Jun He, Hefei (CN); Jie Liu, Hefei (CN); Changhao Quan, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 540 days.

(21) Appl. No.: 17/472,814

(22) Filed: Sep. 13, 2021

(65) Prior Publication Data

US 2021/0402660 A1 Dec. 30, 2021

Related U.S. Application Data

(63) Continuation of application No. PCT/CN2021/075943, filed on Feb. 8, 2021.

(30) Foreign Application Priority Data

Feb. 19, 2020 (CN) .................. 202010102448.X

(51) Int. Cl.
*H01L 21/56* (2006.01)
*B29C 45/27* (2006.01)
*B29L 31/34* (2006.01)

(52) U.S. Cl.
CPC ............ *B29C 45/27* (2013.01); *H01L 21/563* (2013.01); *H01L 21/565* (2013.01); *B29L 2031/34* (2013.01)

(58) Field of Classification Search
CPC .............................. B29C 45/27; H01L 21/563
See application file for complete search history.

(56) References Cited

U.S. PATENT DOCUMENTS 5,077,237 A * 12/1991 Hara ................... H01L 21/565
264/272.17
5,981,312 A * 11/1999 Farquhar ................ H01L 24/32
257/E23.125
(Continued)

FOREIGN PATENT DOCUMENTS

| CN | 1747143 A | 3/2006 |
|---|---|---|
| CN | 101361175 A | 2/2009 |

(Continued)

OTHER PUBLICATIONS

First Office Action of the Chinese application No. 202010102448.X, issued on Mar. 3, 2022, 21 pgs.
(Continued)

*Primary Examiner* — Eugene Lee
(74) *Attorney, Agent, or Firm* — Kilpatrick Townsend & Stockton LLP

(57) ABSTRACT

An injection mould and an injection moulding method are provided. The injection mould includes: a base plate, configured to place a package chip to be injection-moulded, the package chip including a substrate and at least one chip fixed on a surface of the substrate by a flip chip process, the substrate having a through hole, a glue injection channel being formed in the base plate and configured to inject a moulding compound, and the glue injection channel being connected with the through hole on the substrate. The above-mentioned injection mould can improve the reliability of the package chip after injection moulding.

6 Claims, 8 Drawing Sheets

(56) References Cited

U.S. PATENT DOCUMENTS

| | | | |
|---|---|---|---|
| 5,998,243 A * | 12/1999 | Odashima | B29C 45/14655 438/126 |
| 6,081,997 A * | 7/2000 | Chia | H01L 21/565 29/841 |
| 6,232,667 B1 * | 5/2001 | Hultmark | H01L 21/563 257/E21.511 |
| 6,324,069 B1 * | 11/2001 | Weber | H01L 21/565 29/841 |
| 6,383,846 B1 | 5/2002 | Shen | |
| 6,455,349 B2 * | 9/2002 | Brand | H01L 24/75 438/106 |
| 7,005,101 B2 | 2/2006 | Murugan | |
| 7,144,245 B2 * | 12/2006 | Bolken | H01L 21/565 257/E21.504 |
| 7,163,840 B2 * | 1/2007 | Chen | H01L 23/36 257/E23.101 |
| 7,371,606 B2 * | 5/2008 | Ujiie | H01L 21/561 257/667 |
| 9,024,448 B2 * | 5/2015 | Jang | H01L 21/561 257/774 |
| 9,070,679 B2 * | 6/2015 | Wu | H01L 23/49894 |
| 11,820,058 B2 * | 11/2023 | He | B29C 45/14344 |
| 2001/0015010 A1 * | 8/2001 | Tsukamoto | H01L 24/81 257/E21.511 |
| 2002/0043389 A1 | 4/2002 | Murugan | |
| 2002/0173074 A1 * | 11/2002 | Chun-Jen | H01L 21/563 257/E21.503 |
| 2003/0132019 A1 | 7/2003 | Murugan | |
| 2004/0203194 A1 * | 10/2004 | Hamasaki | H01L 23/4334 257/E23.092 |
| 2005/0035491 A1 | 2/2005 | Bagnall | |

FOREIGN PATENT DOCUMENTS

| | | |
|---|---|---|
| CN | 101540289 A | 9/2009 |
| CN | 101577259 A | 11/2009 |
| CN | 106449945 A | 2/2017 |
| CN | 108962771 A | 12/2018 |
| CN | 110660891 A | 1/2020 |
| EP | 0340099 A1 | 11/1989 |
| JP | H11145168 A | 5/1999 |
| JP | 2001223231 A | 8/2001 |
| JP | 2004119816 A | 4/2004 |
| JP | 2004363323 A | 12/2004 |
| TW | 393745 B | 6/2000 |

OTHER PUBLICATIONS

International Search Report in the international application No. PCT/CN2021/075943, mailed on Apr. 15, 2021, 2 pgs.

* cited by examiner

INJECTION MOULD AND INJECTION MOULDING METHOD

CROSS-REFERENCE TO RELATED APPLICATION

The present application is a U.S. continuation application of International Application No. PCT/CN2021/075943, filed on Feb. 8, 2021, which claims priority to Chinese Patent Application No. 202010102448.X, filed on Feb. 19, 2020. International Application No. PCT/CN2021/075943 and Chinese Patent Application No. 202010102448.X are incorporated herein by reference in their entireties.

TECHNICAL FIELD

The disclosure relates to the field of chip package, and more particularly to an injection mould and an injection moulding method.

BACKGROUND

After a chip is packaged, the packaged chip needs to be wrapped through injection moulding, so as to protect the chip.

For a chip packaged by a flip chip process, the chip is connected with a circuit on a substrate by solder balls. In a moulding process, a moulding compound is required to wrap the whole chip and fill up a gap between the chip and the substrate. Since the chip and the substrate are directly connected through the solder balls, the gap is relatively small, and the spacing distance between the solder balls is also relatively small. As a result, air is difficult to exhaust when the moulding compound is filled, which easily lead to an unreliable package structure.

In the related art, in order to facilitate the exhaust of gas in an injection moulding process, a gas hole is arranged on a package substrate, so that the gas is exhausted from the gas hole on the substrate with the filling of the moulding compound in the injection moulding process. However, in the injection moulding process, the substrate is contacted to a surface of a base plate of a package mould, and the gas hole is easily blocked, so that the problem that the gas cannot be exhausted still exists.

Therefore, how to avoid gas residue in a package body in the injection moulding process is a problem to be solved urgently at present.

SUMMARY

The technical problem to be solved by the disclosure is to provide an injection mould and an injection moulding method to improve the reliability of a package chip after injection moulding.

In order to solve the above problem, the disclosure provides an injection mould, which includes: a base plate, configured to place a package chip to be injection moulded, the package chip including a substrate and at least one chip fixed on a surface of the substrate by a flip chip process, the substrate having a through hole; a glue injection channel being formed in the base plate and configured to inject a moulding compound, and the glue injection channel being connected with the through hole on the substrate.

The technical solution of the disclosure further provides an injection moulding method, which includes that the following acts. The above-mentioned injection mould and package chip to be injection-moulded are provided, the package chip including a substrate and at least one chip fixed on a surface of the substrate by a flip chip process, and the substrate having a through hole. The package chip is placed on a base plate of the injection mould, and a cover covers on the base plate to form a cavity, the package chip being located in the cavity, a back surface of the substrate being contacted to a surface of the base plate, and the through hole on the substrate of the package chip being connected with a glue injection channel in the base plate. First injection is executed, the first injection including that: a moulding compound in a state of liquid is injected into the cavity via the glue injection channel in the base plate and the through hole on the substrate or gas in the cavity is exhausted.

DETAILED DESCRIPTION

As described in the background, in the related art, there is a problem that gas cannot be exhausted when injection moulding is executed on a package chip derived from a flip chip.

In order to solve the above-mentioned problem, the inventor proposes a new injection mould and an injection moulding method to improve the above-mentioned problem.

Specific examples of the new injection mould and the injection moulding method provided by the disclosure will be described below in detail in combination with the accompanying drawings.

Figure 1A:
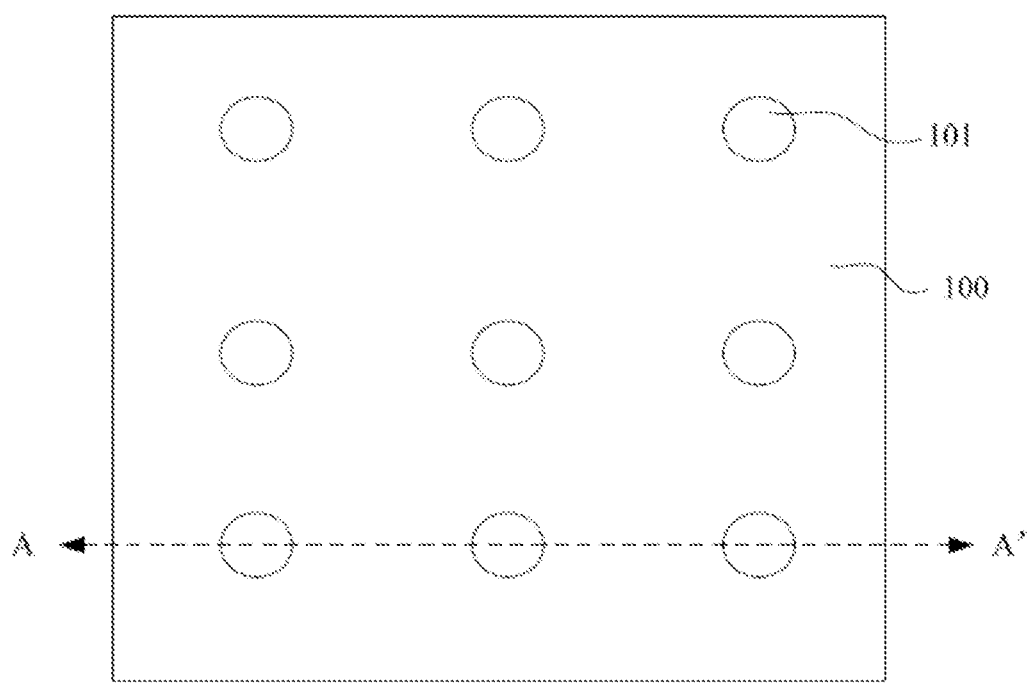
FIG. 1A and FIG. 1B are schematic structural diagrams of a base plate of an injection mould according to a specific example of the disclosure.
Figure 1B:
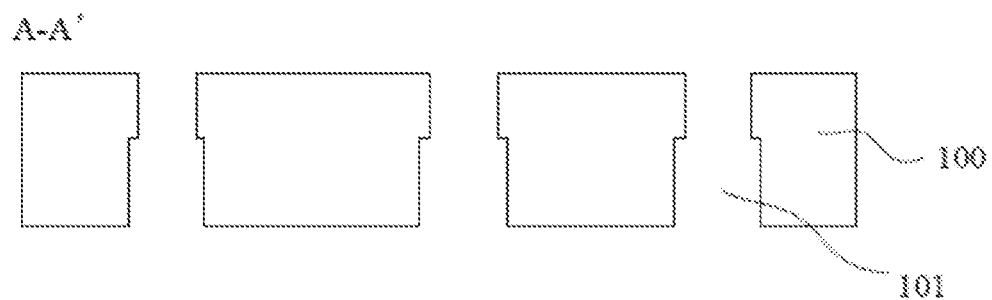

Referring to FIG. 1A and FIG. 1B, which are schematic structural diagrams of an injection mould of a specific example of the disclosure. FIG. 1A is a schematic top view of a base plate 100 of the injection mould; and FIG. 1B is a schematic cross-sectional view taken along a section line AA' in FIG. 1A.

The injection mould includes a base plate 100, the base plate 100 is configured to place a package chip to be injection-moulded, a glue injection hole 101 is formed in the base plate 100, and the glue injection hole 101 is configured to inject a moulding compound into the injection mould from the outside. The outside refers to the exterior of the injection mould.

In this specific example, several separate glue injection holes 101 penetrate through the base plate 100 and serve as glue injection channels in the base plate 100. In this specific example, a cross section of the glue injection hole 101 is a circle in a direction parallel to a surface of the base plate 100. In other specific examples, the cross section of the glue injection hole 101 has other shapes such as a polygon, an ellipse, and a rectangle. In other specific examples, the glue injection channel may also be in the form of an elongated groove and configured to simultaneously connect multiple through holes on a substrate of the package chip, so as to simultaneously inject the moulding compound into the multiple through holes.

The package chip to be injection-moulded includes the substrate and at least one chip fixed on a surface of the substrate by a flip chip process, and the substrate has the through hole. In this specific example, the glue injection hole 101 is distributed in an array and corresponds to the through hole on the package chip to be injection-moulded one by one The glue injection hole 101 is connected with the through hole on the substrate when the package chip is placed on the base plate 100.

In other specific examples, the number of the glue injection hole 101 is greater than that of the through hole, so as to adapt to more types of package chips. Those skilled in the art would be able to rationally arrange the distribution of the glue injection hole 101 according to a practical requirement.

Figure 2:
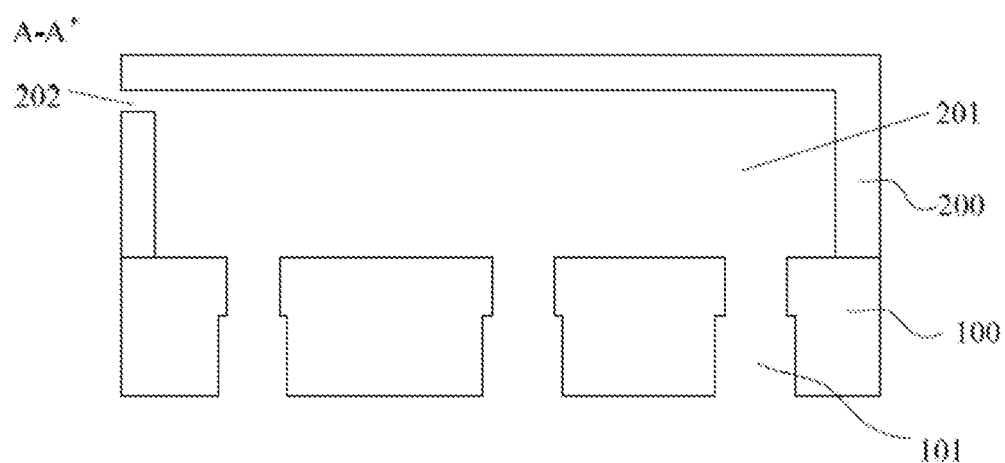
FIG. 2 is a schematic structural diagram of an injection mould according to a specific example of the disclosure.

Referring to FIG. 2, the injection mould further includes a cover 200, the cover 200 is configured to cover on the base plate 100 and form a cavity 201 with the base plate 100, and the cavity 201 is configured to accommodate a package chip to be injection-moulded.

The moulding compound is injected into the cavity 201 through the glue injection hole 101 in the base plate 100, so as to execute moulding on the package chip placed in the cavity 201.

In order to control a flow rate of the moulding compound injected into the cavity 201 in an injection moulding process, in this specific example, along a moulding compound injection direction, the area of an injection port of the glue injection hole 101 in the base plate 100 is larger than or equal to that an outflow port, so that the flow rate of the moulding compound flowing into the mould is appropriately slowed down, and in the injection moulding process, the separation between the chip and the substrate due to the fact that the package chip bears a large impact force resulting from a high flow rate of the moulding compound is avoided. In this specific example, the glue injection hole 101 includes two portions with different diameters, the portion with a larger diameter is located at an injection inlet and the portion with a smaller diameter is located at an outlet end.

In other specific examples, the glue injection hole 101 is a conical hole with an inclined side wall; or the cross-sectional area at each position of the glue injection hole 101 is the same.

In this specific example, the cover 200 has an opening hole as an injection hole 202, which is configured to inject the moulding compound into the cavity 201. In other specific examples, the cover 200 has two or more injection holes 202, and the moulding compound is injected into the cavity through two or more injection holes 202, so that the efficiency is improved. At least two opening holes are formed on the cover 200 and are configured to inject the moulding compound into the cavity or exhaust gas in the cavity, and the cover 200 is arranged according to a specific situation.

A particular hole may also be formed on the cover 200 as a gas outlet hole (not shown) and is configured to connect the cavity 201 and the exterior of the injection mould, and to exhaust the gas from the cavity 201 to the outside in a process of injecting the moulding compound into the cavity 201.

In other specific examples, at least two opening holes are formed on the cover 200 and are configured to inject the moulding compound into the cavity or exhaust the gas from the cavity. The function of each opening hole is arranged according to a specific situation.

In other specific examples, one end of the glue injection channel has a first opening on a surface of the base plate in contact with the package chip, the first opening is connected with the through holes on the substrate, the other end of the glue injection channel has a second opening on a surface of the base plate farther away from the package chip, and the second opening is configured to inject the moulding compound into the injection mould from the outside. The outside is the exterior of the injection mould.

Figure 3A:
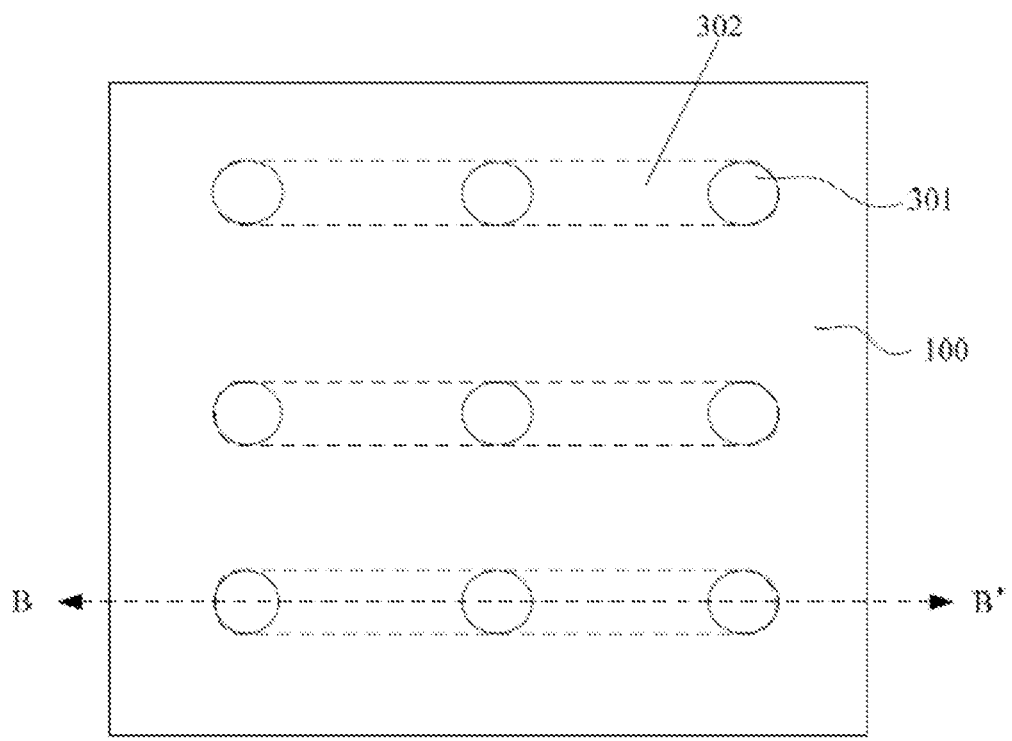
FIG. 3A and FIG. 3B are schematic structural diagrams of a base plate according to a specific example of the disclosure.
Figure 3B:
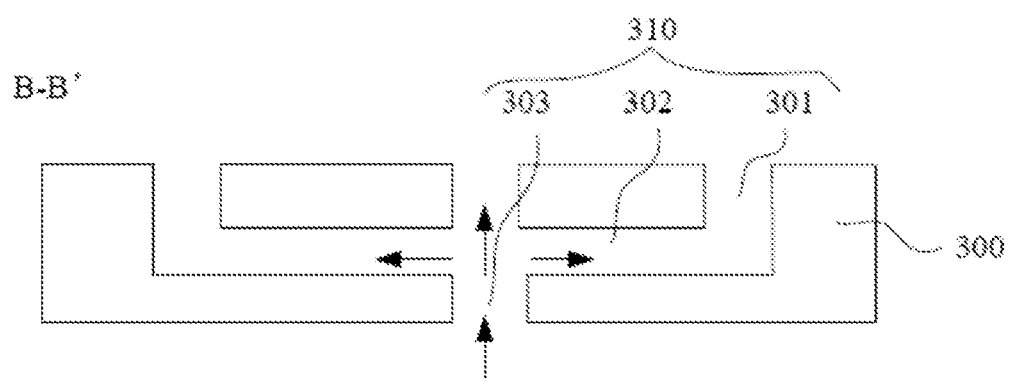

FIG. 3A and FIG. 3B are schematic structural diagrams of a base plate 300 according to a specific example of the disclosure.

In this specific example, multiple sets of glue injection channels 310 are formed in a base plate 300, and each set of glue injection channel 310 is configured to connect a through hole on the same line on a substrate of a package chip.

The base plate 300 includes a front surface and a back surface which are opposite, the front surface is the surface in contact with the package chip, and the back surface is the surface farther away from the package chip. The glue injection channel 310 includes a glue injection opening 303 which is a first opening located on the back surface of the base plate 300; a glue injection pipeline 302 which is located in the base plate 300 and is connected with the glue injection opening 303; and several second openings, namely, glue outlet openings 301, which are located on the front surface of the base plate 300. One end of the glue outlet opening 301 is connected with the glue injection pipeline 302, and the other end thereof is connected with the through hole on the substrate of the package chip. The glue outlet opening 301 serves as an end for outflow of the moulding compound, and the glue injection opening 303 serves as an end for inflow of the moulding compound.

The moulding compound is injected into the glue outlet openings 301 at multiple positions through one glue injection opening 303, so that the injection efficiency of the moulding compound is improved.

In other specific examples, the glue injection channel in the base plate 300 may also be connected to all of the glue outlet openings through one glue injection pipeline, so that the moulding compound is simultaneously injected into the glue outlet opening at all positions in the base plate 300, and one or more glue injection openings connected with the glue injection pipeline are included.

In this specific example, the glue injection opening 303 is located on the back surface of the base plate 300; and in other specific examples, the glue injection opening 303 may also be formed on a side wall of the base plate 300, the position of the glue injection opening 303 and the specific connection form of the glue injection pipeline 302 are not limited herein.

In the specific examples of the disclosure, preferably, the area of a moulding compound outflow opening of the glue injection channel in the base plate is larger than or equal to that of the through hole in the substrate Even if a position of the through hole is offset from the moulding compound outflow opening, due to the larger area of the moulding compound outflow opening, an overlapping portion with the through hole still exists, so that the moulding compound is ensured to be injected into the cavity between the cover and the base plate through the through hole.

The injection mould of the above-mentioned specific examples can inject the moulding compound into the cavity formed by the mould through the base plate, and the moulding compound fills the cavity upwards from the surface of the base plate. When the package chip is placed in the cavity, the substrate for the package chip is located on the surface of the base plate, the moulding compound can enter the cavity through the through hole on the substrate, and the moulding compound first fills up the gap between the substrate and the chip, so that the influence on the connection performance between the substrate and the chip resulting from the formation of a pore due to the fact that the gas between the substrate and the chip cannot be exhausted in the injection moulding process can be avoided, and the injection moulding effect is improved.

The specific examples of the disclosure further provide an injection moulding method using the above-mentioned injection mould.

Figure 4:
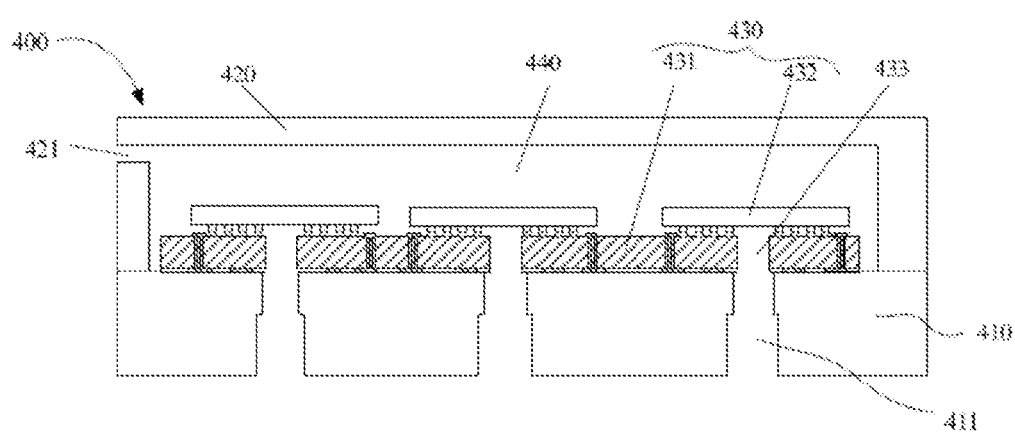
FIG. 4 to FIG. 6 are schematic structural diagrams of an injection moulding process according to a specific example of the disclosure.
Figure 5:
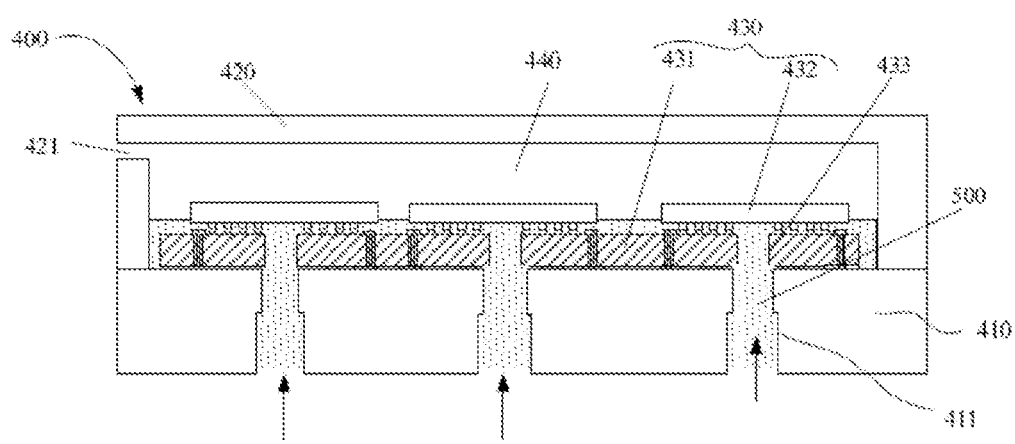
Figure 6:
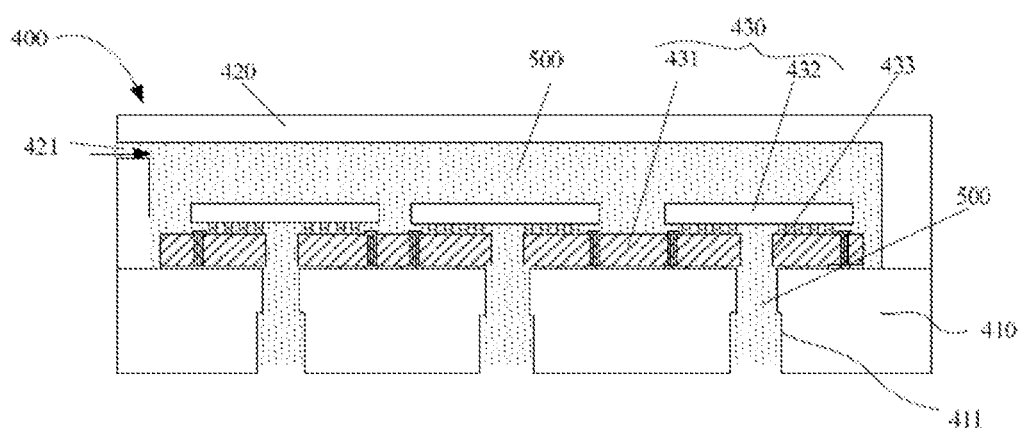

FIG. 4 to FIG. 6 are schematic structural diagrams of an injection moulding process of the disclosure.

Referring to FIG. 4, an injection mould 400 and a package chip to be injection-moulded 430 are provided.

The injection mould 400 includes a base plate 410 and a cover 420, a glue injection channel 411 is formed in the base plate 410, and the cover 420 has an injection hole 421. The specific structure of the injection mould 400 is described by referring to the foregoing specific examples and will not be described in detail herein.

A package chip 430 to be injection-moulded is placed on the base plate 410, the package chip 430 includes a substrate 431 and at least one chip 432 fixed on a surface of the substrate 431 by a flip chip process, and the substrate 431 has a through hole 433; and a cover 420 covers on the surface of the base plate 410 to form a cavity 440, the package chip 430 is located in the cavity 440, a back surface of the substrate 431 is contacted to a surface of the base plate 410, and at least part of the through holes 433 on the substrate 431 of the package chip 430 are connected with the glue injection channel 411 in the base plate 410.

The substrate 431 of the package chip 430 is a circuit board, on which an electrical connection structure such as a circuit, and a welding pad is formed, multiple chips 432 are packaged on the surface of the substrate 431 through the flip chip, the chip 432 is inverted on the surface of the substrate 431 and is electrically connected with the electrical connection structure on the surface of the substrate 431 through a solder ball.

At least one through hole 433 is formed in a substrate area in which each chip 432 of the package chip 430 is located. At least part of the through holes 433 are connected with the glue injection channel 411 in the base plate 410, so that a moulding compound is injected into the cavity 440 through the glue injection channel 411 and the through hole 433. Preferably, all of the through holes 433 in the substrate 431 are connected with the glue injection channel 411 in the base plate 410, so as to improve the injection efficiency of the moulding compound. In this specific example, the through hole 433 is a circular hole having a size slightly smaller than the moulding compound outflow opening of the glue injection channel 411 in the base plate 410.

Referring to FIG. 5, first injection is executed, the first injection includes that: a liquid moulding compound 500 is injected into the cavity 440 through the glue injection channel 411 in the base plate 410 and the through hole 433 on the substrate 431.

In the first injection process, the moulding compound 500 is injected into each through hole 433 simultaneously or sequentially via the glue injection channel 411.

In this specific example, since the glue injection channels 411 are independent of each other, the injection of the moulding compound 500 can be sequentially executed, and the injection of the glue injection channel 411 is executed after a gap between the chip 432 and the substrate 431 above the through hole 433 connected with the glue injection channel 411 is filled up. In other specific examples, the moulding compound 500 is simultaneously injected into each glue injection channel 411.

When the moulding compound is injected into the cavity 440 through the glue injection channel 411 in the base plate 410, a flow direction of the moulding compound is toward the chip 432 and when the moulding compound 500 is filled between the chip 432 and the substrate 431, as the moulding compound 500 is continuously filled, an acting force causing the chip 432 to deviate from the substrate 431 is applied to the chip 432. Therefore, if an injection flow rate of the moulding compound is too high, the reliability at a connection position between the chip 432 and the substrate 431 is reduced, and the solder ball between the chip 432 and the substrate 431 may fall off, thereby resulting in failure of the electrical connection between the chip 432 and the substrate 431.

Therefore, in a processing of injecting the moulding compound 500, it is necessary to control the flow rate of the injection. Specifically, an injection moulding pressure of the moulding compound 500 flowing into the cavity 440 from each through hole 433 in the first injection process may be controlled in a range of 7E6 Pa to 1E7 Pa.

Referring to FIG. 6, in the first injection process, when a liquid moulding compound fills up a gap between the chip 432 and the substrate 431, the first injection is stopped; and second injection is executed until the moulding compound 500 fills up the cavity 440 (referring to FIG. 5).

The second injection includes that: the moulding compound in the liquid state 500 is injected into the cavity 440 through an injection hole 421 on the cover 420 of the injection mould 400. When the cover 420 has two or more injection holes 421, the moulding compound is injected into the cavity through the two or more injection holes 421, so that the efficiency is improved.

In this specific example, the injection hole 421 is located on a side wall of the cover 420; and in other specific examples, the injection hole 421 may also be located at the top of the cover 420.

In the second injection process, the moulding compound is injected from the top of the chip 432, and the moulding compound applies a pressure on the chip 432 towards the substrate 431 without causing the separation between the chip 432 and the substrate 431. Therefore the moulding compound flow rate of the second injection is appropriately increased, the moulding compound flow rate of the second injection is higher than that of the first injection, and the injection efficiency is improved.

In the second injection process, the gas at an upper portion of the cavity 440 may exhausted through a vent hole on the cover 420.

In other examples, the second injection may also be executed while the first injection is executed; the flow rate of the second injection is controlled, so that the moulding compound flow rate of the second injection is lower than that of the second injection. By doing so, the gap between the chip 432 and the substrate 431 can be filled up with the moulding compound injected by the first injection process before the upper portion of the cavity 440 is filled up with the second injection, so that all the gas in the gap between the chip 432 and the substrate 431 enters the upper portion of the cavity 440 and is exhausted through the gas hole on the cover 420.

After the moulding compound in the liquid state fills up the cavity, a heat treatment is executed to solidify the moulding compound in the liquid state 500; and the package chip 510 wrapped by the solidified moulding compound is taken out from a package mould.

In this specific example, in the moulding process, a moulding compound 600 enters a first gas channel 411 from a through hole on a substrate 511, and when the package chip 430 is taken out of the mould, the moulding compound formed in the through hole 433 is taken out together, so that a back surface of the substrate 431 has a moulding compound bulge which seals the through hole 433.

After the package chip 430 is taken out, a solder ball is formed on the other side surface of the substrate 431 of the package chip 430, the solder ball is electrically connected with the chip 432 on a front surface of the substrate 431 through an electrical connection structure in the substrate 431; and then, the substrate 431 is cut to form an injection-moulded package chip including the single chip 432.

According to the above-mentioned injection moulding method, firstly, the moulding compound is injected into the cavity via the glue injection channel on the base plate of the injection mould and the through hole on the substrate of package chip, the moulding compound is filled in a direction from the surface of the substrate to the chip, and the space between the chip and the substrate is filled up firstly; and then the moulding compound is injected into the cavity above the chip, so that the problem that the pore occurs due to the fact that the gas between the chip and the substrate cannot be exhausted can be avoided.

The above are only preferred examples of the disclosure. It should be pointed out that those of ordinary skill in the art may also make some improvements and modifications without departing from the principle of the disclosure. These improvements and modifications should fall within the scope of protection of the disclosure.

The invention claimed is:

1. An injection moulding method, comprising:
providing the injection mould and a package chip to be injection-moulded, the package chip comprising a substrate and at least one chip fixed on a surface of the substrate by a flip chip process, and the substrate having a through hole; and, wherein the injection mould, comprises: a base plate, configured to place a package chip to be injection-moulded, the package chip comprising a substrate and at least one chip fixed on a surface of the substrate by a flip chip process, the substrate having a through hole; and a glue injection channel formed in the base plate, configured to inject a moulding compound, the glue injection channel being connected with the through hole on the substrate; wherein one end of the glue injection channel has a first opening on a surface of the base plate in contact with the package chip, the first opening being connected with the through hole on the substrate, another end of the glue injection channel has a second opening on a surface of the base plate farther away from the package chip, and the second opening being configured to inject the moulding compound into the injection mould from outside, an area of the second opening of the glue injection channel is larger than that of the first opening;
placing the package chip on a base plate of the injection mould, and covering with a cover on the base plate to form a cavity, the package chip being located in the cavity, a back surface of the substrate being contacted to a surface of the base plate, and the through hole on the substrate of the package chip being connected with a glue injection channel in the base plate;
executing a first injection, the first injection comprising: injecting a moulding compound in a liquid state into the cavity via the glue injection channel in the base plate and the through hole on the substrate; and
executing a second injection, the second injection comprising: injecting the moulding compound in the liquid state into the cavity through an opening hole on the cover of the injection mould, wherein the moulding compound flow rate of the second injection is higher than that of the first injection.

2. The injection moulding method of claim 1, wherein in a process of executing the first injection, when the moulding compound in the liquid state fills up a gap between the chip and the substrate, the first injection is stopped, and the second injection is executed until the cavity is filled up.

3. The injection moulding method of claim 1, wherein the moulding compound is injected into the cavity through the opening hole.

4. The injection moulding method of claim 3, wherein the through hole is formed in a substrate area on which each of the package chips is disposed.

5. The injection moulding method of claim 4, wherein in the first injection process, the moulding compound is injected into each through hole simultaneously or sequentially via the glue injection channel.

6. The injection moulding method of claim 1, further comprising: after the moulding compound in the liquid state fills up the cavity, executing a heat treatment to solidify the moulding compound in the liquid state.

* * * * *